United States Patent [19]
Rai et al.

[11] Patent Number: 6,038,172
[45] Date of Patent: Mar. 14, 2000

[54] MEMORY DEVICE WITH DUMMY CELL TRANSISTOR

[75] Inventors: Toshiki Rai; Sadao Yoshikawa, both of Gifu-ken, Japan

[73] Assignee: Sanyo Electric Co. Ltd., Osaka, Japan

[21] Appl. No.: 09/272,458

[22] Filed: Mar. 19, 1999

[30] Foreign Application Priority Data

Mar. 26, 1998 [JP] Japan ................................. 10-078786

[51] Int. Cl.⁷ .................................................. G11C 16/06
[52] U.S. Cl. ..................... 365/185.2; 365/185.2; 365/185.21; 365/185.1; 365/185.18; 365/185.25
[58] Field of Search ........................... 365/185.2, 185.21, 365/185.1, 185.18, 185.25

[56] References Cited

U.S. PATENT DOCUMENTS

| | | | |
|---|---|---|---|
| 5,563,826 | 10/1996 | Pascucci et al. | 365/185.21 |
| 5,699,295 | 12/1997 | Yero | 365/185.21 |
| 5,805,500 | 9/1998 | Campardo | 365/185.2 |

*Primary Examiner*—David Nelms
*Assistant Examiner*—Connie C Yoha
*Attorney, Agent, or Firm*—Fish & Richardson P.C.

[57] ABSTRACT

A non-volatile semiconductor memory device including a memory cell transistor, a bit line connected to the memory cell transistor, a current controlling element connected between the bit line and a first potential, a dummy cell transistor connected between the bit line and a second potential, and a decoder connected to the memory cell transistor and the dummy cell transistor. The memory cell transistor has an electrically isolated floating gate electrode which varies an on resistance that depends on an amount of charge stored on the floating gate electrode. The decoder, which controls the memory cell transistor and the dummy cell transistor, is operative during a first interval to turn the dummy cell transistor on to apply the second potential to the bit line which is connected to the first potential via said current controlling element and it is operative during a second interval to turn the memory cell transistor on to allow the second potential to be applied to the bit line via the memory cell transistor, thereby allowing a write-in current to pass via the memory cell transistor.

5 Claims, 2 Drawing Sheets

MEMORY DEVICE WITH DUMMY CELL TRANSISTOR

BACKGROUND OF THE INVENTION

The present invention relates to a semiconductor memory device, and more particularly, to a non-volatile semiconductor memory device capable of performing a stable write operation.

A conventional electrically erasable programmable ROM (EEPROM) contains memory cells including a plurality of transistors each having a double structure of a floating gate and a control gate. Data is written into a memory cell transistor by causing hot electrons produced in the drain region of the floating gate to be accelerated into the source region thereof with part of the accelerated electrons injected into the floating gate. Data is read from the cell by detecting a change in the operating characteristic of the memory cell transistor, which depends on the amount of change injected into the floating gate. In other words, a data read operation takes place by detecting a change in the threshold value of the memory cell transistor.

Referring to FIG. 1, a conventional semiconductor memory device 100 will now be described. The memory device 100 comprises a plurality of memory cell transistors 1 arranged in four rows and one column, and a row decoder 6 connected to the memory cell transistors 1. In FIG. 1, a column select circuit is omitted from the illustration.

Each memory cell transistor 1 comprises an electrically isolated floating gate and which stores a charge, a control gate partly overlapping the floating gate, a source region and a drain region. The memory cell transistors 1 are turned on/off in accordance with a potential applied to the control gates. Each memory cell transistor 1 has a threshold value which varies depending on the amount of charge stored on the floating gate. Two adjacent memory cell transistors form a pair.

A word line 2 is associated with each row of memory cell transistors, and interconnects the control gate of each memory cell transistor 1 and the row decoder 6. A bit line 3 is disposed in a manner corresponding to the column of memory cell transistors 1. The bit line 3 is connected to the drains of respective memory cell transistors 1 and is connected to a current control transistor 5. A source line 4 is connected to the sources of each pair of adjacent memory cell transistors 1. During a write operation, a write potential Vp is applied to the source of each memory cell transistor 1 via the source line 4.

The current control transistor 5 has a source connected to the bit line 3, a drain connected to ground, and a gate. The current control transistor 5 controls the amount of a write-in current ip which flows from the bit line 3 to the ground in accordance with a gate potential Vci. During the write operation, the potential Vp is applied to the source of the memory cell transistor 1 via the source line 4. When the current control transistor 5 is turned on in response to the gate potential Vci, the bit line 3 is connected to the ground via the current control transistor 5. The write-in current ip then passes via a selected one of the memory cell transistors 1. The current control transistor 5 maintain the amount of the write-in current ip constant.

The row decoder 6 receives row address information from a control circuit, not shown, and operates one of row select signals LS1 to LS4, which activates a corresponding one of the four word lines 2. The row decoder 6 supplies the row select signals LS1–LS4 to the associated word line 2 in response to a select clock φc. In this manner, one of the memory cell transistors 1 which is connected to the activated word line 2 is turned on.

While only one column of memory cell transistors 1 is shown in FIG. 1, it should be understood that the memory cell transistors 1 may be arranged to form a plurality of columns. In such instance, a column decoder, not shown, selects one of the columns in accordance with column address information. Subsequently, one of the plurality of memory cell transistors 1 located within the selected column is selected in accordance with the row address information.

The select clock φc is produced or rises when address information is switched. As shown in FIG. 2, the select clock φc includes a first interval P1 at which time the address information is switched and a second interval P2 when a write operation with respect to the memory cell transistor 1 takes place. In the first interval P1, the row select signals LS1 to LS4 establish a non-select condition of all the memory cell transistors until the switching of address information is completed. In the meantime, the bit line 3 is maintained electrically floating. The current control transistor 5 is turned on in response to the gate potential Vci. In the second interval P2, one of the row select signals LS1 to LS4 rises to select one of the memory cell transistors 1 in accordance with the address information which has been completely switched. The write-in current ip then passes from the source line 4 to the bit line 3 via the selected one of the memory cell transistors 1.

In FIG. 2, a solid line indicates a change in the bit line potential VBL when the floating gate of the memory cell transistor 1 is not charged, and broken lines indicate a corresponding change when the floating gate of the memory cell transistor 1 is charged. When the potential of the floating gate of the memory cell transistor 1 is at the ground potential, the bit line potential VBL gradually rises with a flow of the write-in current ip. After a predetermined time interval passes, the potential VBL converges to a potential which is determined by the ratio of the drive capabilities of the memory cell transistor 1 and the current control transistor 5.

The write-in amount or the amount of charge injection into the memory cell transistor 1 is determined by the magnitudes of the write-in potential Vp and the write-in current ip and the interval during which the write-in current ip is allowed to pass. Accordingly, to achieve a stable write operation, it is preferred that the interval of the write operation be controlled accurately and that during the write-in interval, the write-in potential Vp and the write-in current ip be maintained constant.

However, it can be seen from FIG. 2 that if the bit line potential VBL is as low as close to the ground potential, there is a significant potential difference between the source line 4 and the bit line 3 at the commencement of the write operation. This causes a momentary increase in the write-in current ip which passes via the memory cell transistor 1. The momentary increase of the write-in current ip leads to an unstable write operation with respect to the memory cell transistor 1, occasionally causing a variation in the write-in amount. In particular, when driving the semiconductor memory device 100 at a low voltage or when multi-state data is to be written into the memory cell transistor 1, a variation in the write-in amount is likely to cause a write-in error.

It is an object of the invention to provide a semiconductor memory device which enables a stable write operation with respect to a memory cell transistor.

SUMMARY OF THE INVENTION

To achieve the above objective, the present invention provides a non-volatile semiconductor memory device comprising: a memory cell transistor having an electrically isolated floating gate and exhibiting an on resistance which depends on an amount of charge stored on the floating gate; a bit line connected to the memory cell transistor; a current controlling element connected between the bit line and a first potential; a dummy cell transistor connected between the bit line and a second potential; and a decoder connected to the memory cell transistor and the dummy cell transistor for controlling each of them, the decoder being operative during a first interval to turn the current controlling element on to connect the bit line and the first potential and to turn the dummy cell transistor on to apply the second potential to the bit line and operative during a second interval to turn the memory cell transistor on to allow the second potential to be applied to the bit line via the memory cell transistor, thereby allowing a write-in current to pass via the memory cell transistor.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENT

Figure 1:
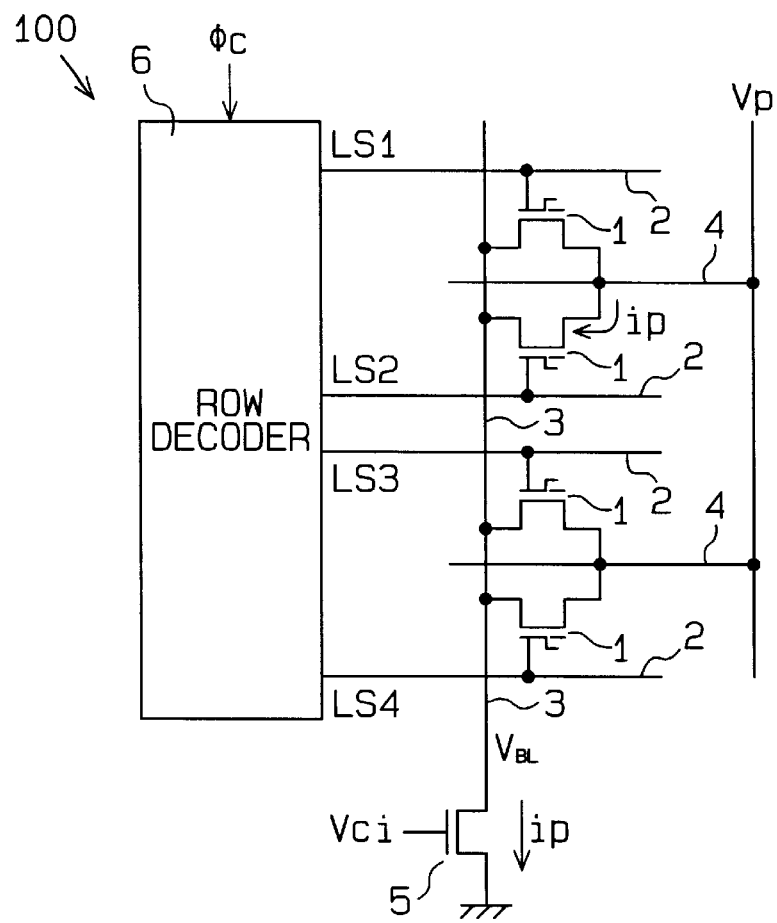
FIG. 1 is a circuit diagram of a conventional non-volatile semiconductor memory device.
Figure 2:
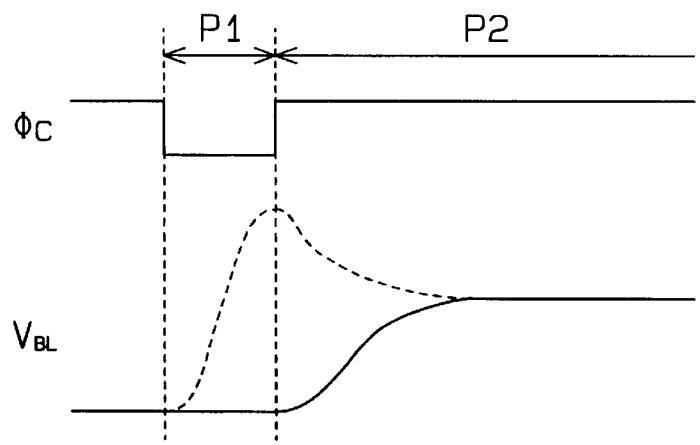
FIG. 2 is a timing chart illustrating the operation of the memory device of FIG. 1.
Figure 3:
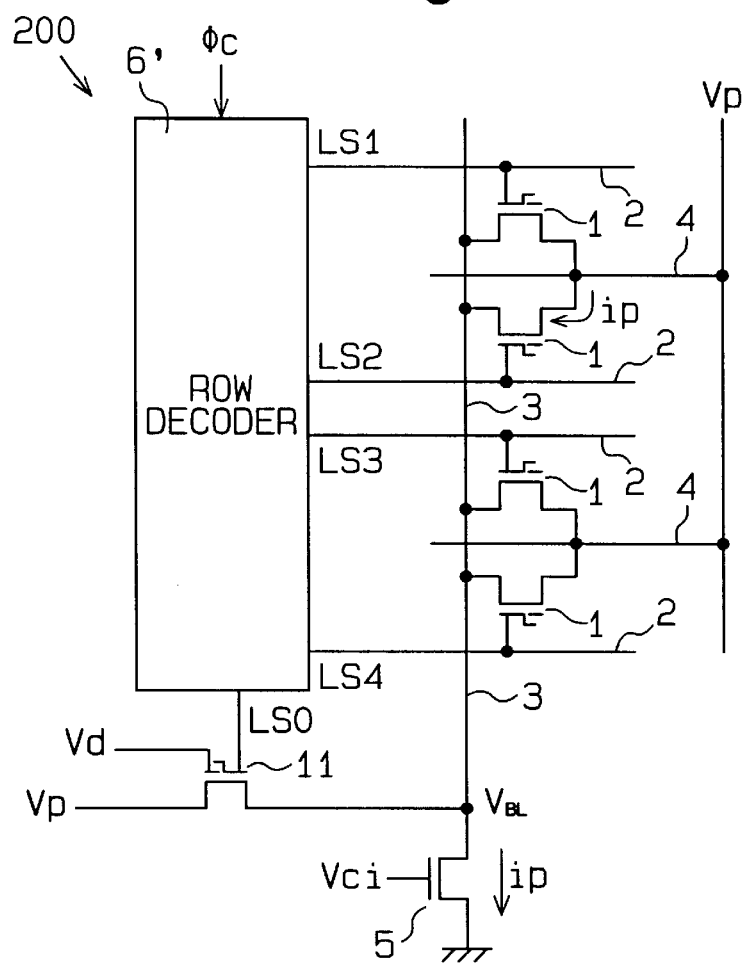
FIG. 3 is a circuit diagram of a non-volatile semiconductor memory device according to one embodiment of the present invention.
Figure 4:
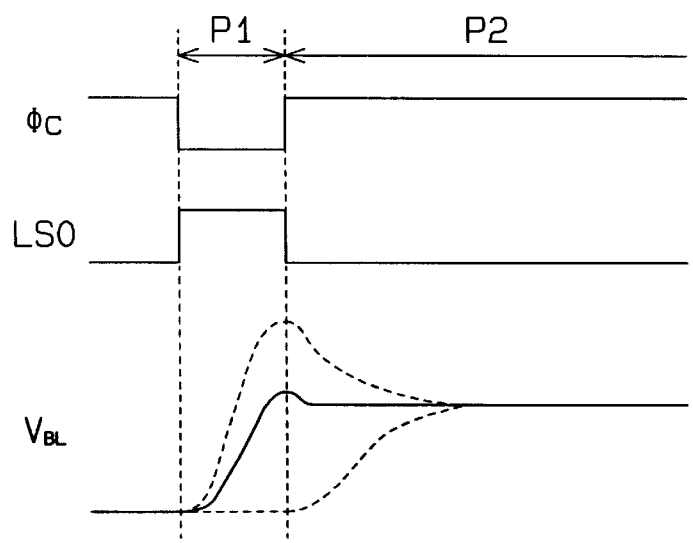
FIG. 4 is a timing chart illustrating the operation of the memory device of FIG. 3.

Referring now to FIGS. 3 and 4, a non-volatile semiconductor memory device 200 according to one embodiment of the invention will now be described, principally dealing with its distinction over the conventional non-volatile memory device 100.

The semiconductor memory 200 of the present embodiment is includes a dummy cell transistor 11 connected to the bit line 3. Describing the operation of the semiconductor memory device 200, prior to the commencement of the write operation, the write-in potential Vp from a control circuit, not shown, is fed via the dummy cell transistor 11 to the bit line 3 to precharge the bit line 3. Subsequently, the write-in potential Vp is applied to the memory cell transistor 1 via the source line 4. Since the bit line 3 is precharged to a predetermined potential at this time, any significant potential rise on the bit line 3, at the commencement of the write operation, is prevented.

Referring to FIG. 3, the dummy cell transistor 11 is preferably constructed in the same manner as the memory cell transistor 1, and is connected in parallel with the memory cell transistors 1 between the bit line 3 and the write-in potential Vp. The dummy cell transistor 11 has a floating gate, a control gate connected to a row decoder 6', a source connected to the write-in potential Vp and a drain connected to the bit line 3.

The floating gate of the dummy cell transistor 11 is connected to a supply voltage Vd. By applying a predetermined potential to an floating gate, the dummy cell transistor 11 is maintained in its erased condition.

The control gate of the dummy cell transistor 11 receives a control signal LS0 from the row decode 6'. The control signal LS0 has a high level which is substantially equal to the activation level of the row select signal LS1–LS4 when one of the word lines 2 is selected. The control signal LS0 rises preceding any of the row select signals LS1 to LS4 and falls before any one of the row select signals LS1 to LS4 rises. The dummy cell transistor 11 has an on resistance, which is preferably substantially equal to the on resistance presented by the memory cell transistor 1 at the commencement of the write operation. Accordingly, the potential Vp (or the precharge level) applied to the bit line 3 via the dummy cell transistor 11 is substantially identical with the potential VBL, to which the bit line 3 stabilizes after the commencement of the write operation.

The row decoder 6' produces the control signal LS0 during the first interval P1 (see FIG. 4), and the control signal LS0 is applied to the control gate of the dummy cell transistor 11. In response to the select clock φc, the row decoder 6' applies one of the row select signals LS1 to LS4 to the word line 2 during the second interval P2 (see FIG. 4), thus selectively activating one of the four word lines 2. As will be noted from FIG. 4, the high level of the control signal LS0 is substantially identical with that of the select signals LS1 to LS4. The control signal LS0 rises during the first interval P1 which is provided for the purpose of initialization, thus turning the dummy cell transistor 11 on.

Referring now to FIG. 4, the operation of the semiconductor memory device 200 will be described in detail. The select clock φc is produced in synchronism with the timing when address information is switched to define the first interval P1 which is used for initialization and the second interval P2 during which the write operation takes place with respect to the memory cell transistor 1. During the first interval, none of the row select signals LS1 to LS4 rises, and thus all of the memory cell transistors 1 are in their non-select conditions. During the first interval P1, the control signal LS0 is maintained at its high level to turn the dummy cell transistor 11 on. In this manner, the write-in potential Vp is fed to the bit line 3 via the dummy cell transistor 11. As a consequence, during the first interval P1, the potential VBL on the bit line 3 is precharged to a potential which is lower than the write-in potential Vp by a voltage drop across the dummy cell transistor 11.

During the second interval P2, one of the row select signals LS1 to LS4 rises to select one of the memory cell transistors 1, and the write-in current ip flows via the selected memory cell transistor 1 from the source line 4 to the bit line 3 which has been precharged. Accordingly, at the end of the first interval P1 or at the commencement of the second interval P2, the bit line potential VBL is close to a final stabilized potential which prevails during the second interval. In this manner, a rush-in flow of the write-in current ip via the memory cell transistor 1 at the commencement of the second interval P2 is prevented. In other words, there is no significant increase in the write-in current ip passing via the memory cell transistor 1.

The potential at the control gate of the dummy cell transistor 11 is substantially identical with the potential at the control gate of the selected memory cell transistor 1. Thus the precharge potential varies with a variation in the supply potential Vp. This means that a stabilized write operation is maintained for any variation in the supply potential Vp.

Since the bit line potential VBL is stabilized or converges to a predetermined level in a brief interval, a variation in the amount of write-in into the memory cell transistor 1 diminishes. Such effect is significant in particular as the number of memory cell transistors 1 increases, which increases the capacitance of the bit line, or the voltage level of a drive source is low.

A plurality of memory cell transistors 1 may be disposed to define a matrix. In this instance, the memory cell transistors 1 of differing columns which are disposed on a common row are connected in common to the same word line 2 and the source line 4, and the memory cell transistors 1 of all of the columns and on the same word line 2 which is selected by one of the select signals LS1 to LS4 are selected simultaneously.

The present example is to be considered as illustrative and not restrictive and the invention is not to be limited to the details given herein, but may be modified within the scope and equivalence of the appended claims.

What is claimed is:

1. A non-volatile semiconductor memory device comprising:
    a memory cell transistor having an electrically isolated floating gate electrode varying an on resistance which depends on an amount of charge stored on the floating gate electrode;
    a bit line connected to said memory cell transistor;
    a current controlling element connected between said bit line and a first potential;
    a dummy cell transistor connected between said bit line and a second potential; and
    a decoder connected to said memory cell transistor and said dummy cell transistor for controlling each of them, the decoder being operative during a first interval to turn said dummy cell transistor on to apply the second potential to said bit line which connected to the first potential via said current controlling element and operative during a second interval to turn said memory cell transistor on to allow the second potential to be applied to said bit line via said memory cell transistor, thereby allowing a write-in current to pass via said memory cell transistor.

2. The memory device of claim 1, wherein said dummy cell transistor is substantially similar in construction to said memory cell transistor.

3. The memory device according to claim 2, wherein said dummy cell transistor has a floating gate-like electrode which is substantially the same as the memory cell transistor, the floating gate-like electrode of said dummy cell transistor is applied by a third potential so that it is maintained in an erased condition.

4. An improved memory device of the type having a plurality of floating gate memory cell transistors arranged in a matrix, a current control transistor, and a decoder connected to the memory cell transistors, each memory cell transistor including an electrically isolated floating gate electrode which stores a charge, a control gate for turning on the transistor, a source region and a drain region, a word line associated with each row of the memory cell transistors that connects the control gate of each memory cell transistor in the row with the decoder, a bit line associated with each column of memory cell transistors that connects the drain of each memory cell transistor in the column with the current control transistor, and a source line connecting the sources of adjacent pairs of the memory cell transistors to a write potential, the improvement comprising:
    a dummy cell transistor connected between a predetermined potential and said bit line, wherein the dummy cell transistor is turned on at the beginning of a write operation to precharge said bit line.

5. The improved memory device of claim 4, wherein said dummy cell transistor has substantially the same construction as said memory cell transistors.

* * * * *